United States Patent
Jagt

(10) Patent No.: US 8,247,831 B2
(45) Date of Patent: Aug. 21, 2012

(54) SIDE EMITTING DEVICE WITH WAVELENGTH CONVERSION

(75) Inventor: Hendrik Johannes Boudewijn Jagt, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 153 days.

(21) Appl. No.: 12/742,710

(22) PCT Filed: Nov. 13, 2008

(86) PCT No.: PCT/IB2008/054756
§ 371 (c)(1),
(2), (4) Date: Aug. 20, 2010

(87) PCT Pub. No.: WO2009/066207
PCT Pub. Date: May 28, 2009

(65) Prior Publication Data
US 2011/0018020 A1    Jan. 27, 2011

(30) Foreign Application Priority Data

Nov. 20, 2007 (EP) .................................... 07121079

(51) Int. Cl.
*H01L 31/0232* (2006.01)
(52) U.S. Cl. ........... 257/98; 257/E33.067; 257/E33.068; 438/27; 438/29; 438/31
(58) Field of Classification Search .................... 257/98, 257/E33.067, E33.068; 438/27, 29, 31
See application file for complete search history.

(56) References Cited

U.S. PATENT DOCUMENTS

| 7,019,335 | B2 | 3/2006 | Suenaga |
| 7,180,240 | B2 | 2/2007 | Noguchi et al. |
| 7,510,890 | B2 * | 3/2009 | Ott et al. .......................... 438/29 |
| 7,916,986 | B2 * | 3/2011 | Zhang et al. ..................... 385/31 |
| 2002/0063301 | A1 | 5/2002 | Hanamoto et al. |
| 2002/0109148 | A1 * | 8/2002 | Shveykin ......................... 257/95 |
| 2004/0119083 | A1 | 6/2004 | Su et al. |
| 2005/0148110 | A1 * | 7/2005 | Ott et al. .......................... 438/69 |
| 2006/0202221 | A1 | 9/2006 | Klenke |
| 2006/0203468 | A1 | 9/2006 | Beeson et al. |
| 2007/0077008 | A1 * | 4/2007 | Jeon et al. ........................ 385/49 |
| 2007/0085105 | A1 | 4/2007 | Beeson et al. |
| 2008/0205817 | A1 * | 8/2008 | Budd et al. ....................... 385/14 |
| 2010/0314646 | A1 * | 12/2010 | Breen et al. ...................... 257/98 |

FOREIGN PATENT DOCUMENTS

GB    2428859 A    2/2007

* cited by examiner

*Primary Examiner* — Allan R Wilson
(74) *Attorney, Agent, or Firm* — Mark L. Beloborodov

(57) ABSTRACT

A side-emitting light emitting device (100) is provided, comprising a substrate (101), a reflector (102) arranged spaced apart from said substrate (101) and extending along the extension of said substrate, and at least one light emitting diode (103) arranged on said substrate and facing said reflector, said substrate (101) and reflector (102) delimiting a wave guiding region (104) for light emitted by said at least one light emitting diode (103). Further, a wavelength converting material (105) is arranged at the lateral edge of said wave guiding region (104). The invention provides a compact side emitter with controlled color emission.

12 Claims, 2 Drawing Sheets

SIDE EMITTING DEVICE WITH WAVELENGTH CONVERSION

FIELD OF THE INVENTION

The present invention relates to a side-emitting light emitting device comprising a substrate, a reflector arranged spaced apart from said substrate and extending along the extension of said substrate, and at least one light emitting diode arranged on said substrate and facing said reflector, said substrate and reflector delimiting a wave guiding region for light emitted by said at least one light emitting diode.

BACKGROUND OF THE INVENTION

High brightness LEDs are being introduced in an increasingly number of illumination applications. The steady progress made in LED development with respect to efficiency, brightness and color control enables the penetration of new lighting markets, such as automotive front lighting or general illumination.

Conventional high brightness LEDs emit from the top of the die surface, typically in a 1×1 mm area. As the LEDs emit a rather narrowband wavelength range, they exist in various colors, such as blue, green, amber, red. For instance, for white light emission production, phosphor compositions can be applied that convert part of blue LED emission to higher wavelengths, enabling the emission of white light in various color temperatures. High brightness LEDs are also an attractive choice for backlight applications, such as backlights in display devices and the like.

For backlighting purposes, side-emitting devices are preferred. For many applications, such as hand held devices, mobile phones, PDAs and the like, a thin, small sized backlight arrangement is also desired. One side emitting configuration suitable for use together with top-emissive LEDs is described in GB 2 428 859 A, Avago Technologies. Here is described a back light arrangement for a display device. A curved reflector overlies the LED to redirect the emitted light in a direction essentially parallel to the substrate on which the LED is arranged. The redirected light is introduced in a light pipe comprising features at the bottom surface that redirect light in the light pipe towards the front surface thereof, out from the light pipe and into a light conversion layer. Problems with the arrangement in GB 2 428 859 includes however that it requires a significant thickness and surface area in order to emit the light sidewise. The curved reflector has a much larger footprint than the LED it self. Further, the color conversion into the desired color requires an additional large area light conversion layer separate from the actual side emitter. Hence, there is a need in the art for more compact side emitting devices.

SUMMARY OF THE INVENTION

It is an object of the present invention to at least partly overcome these problems, and to provide a side emitting light emitting device capable of emitting light of a desired color while being compact in size.

Hence, in a first aspect, the present invention provides a side emitting light emitting device, comprising a substrate, a reflector arranged spaced apart from said substrate and extending along the extension of said substrate, and at least one light emitting diode arranged on said substrate and facing said reflector, said substrate and reflector delimiting a wave guiding region for light emitted by said at least one light emitting diode. In the device of the present invention, a wavelength converting material is arranged at lateral edge of said wave guiding region.

Due to the wavelength converting material arranged at the lateral edge of the wave guiding region, it is possible to control the color of the light exiting the device of the invention without the use of externally located converter plates. Light emitting diodes generally emit light in a rather narrow wavelength band. By arranging the wavelength converting material laterally outside of the wave guiding region, no wavelength conversion takes place until the light has exited the wave guiding region. Within the wave guiding region, the light being wave guided up and down is of narrow bandwidth, which makes it relatively easy to optimize the reflective properties of the reflective layer(s) present. Also, it is easy to select a proper material for the wave guiding region, as it preferably should be transparent for the wavelengths of light emitted by the at least one, again due to the narrow bandwidth of light within the wave guiding region. Further, by arranging the wavelength converting material at the lateral edges of the wave guiding region, the light will have a relatively short path length through the wavelength converting material, and will also pass there through at relatively uniform angles, leading to low light loss and uniform wavelength conversion.

The footprint of the wave guiding region does not have to exceed the footprint of the diode, and hence, the device may be made very compact.

In embodiments of the present invention, the wavelength converting material may be arranged between said reflector and said substrate.

When the wavelength converting material is arranged between the reflector and the substrate, light will only exit the wavelength converting material through its lateral outer surface, giving a high directionality of the light.

In embodiments of the present invention, a first dichroic mirror may be arranged between the wave guiding region and the wavelength converting material.

A first dichroic mirror which is transmissive for light coming from the wave guiding region, i.e. not converted light, but reflective of light coming from the wavelength converting material, i.e. wavelength converted light, located between the wave guiding region and the wavelength converting material prevents converted light from reentering the wave guiding region. Instead, it will be reflected out of the device through the wavelength converting material. This will enhance the output efficiency, since a higher percentage of the converted light will exit the device through the intended surface.

In embodiments of the present invention, the wavelength converting material may be arranged between a second dichroic mirror and the wave guiding region.

By sandwiching the wavelength converting material between the wave guiding region and a second dichroic mirror, located laterally outside of the wavelength converting material, it is possible to prevent unconverted light, and converted light with a high angle of incidence on the second dichroic mirror, from exiting the device. Such light will be reflected back into the device.

In embodiments of the present invention, wavelength converting material may be present on two mutually opposing sides of said wave guiding region.

The wavelength converting material can be present on two mutually opposing sides of the wave guiding region. Thus, a bidirectional light emitting device is achieved. In addition, for example in a square device, light may be emitted from all four lateral sides of the device.

In embodiments of the present invention, the substrate may comprise a reflective layer.

When the substrate comprises a reflective layer, the light is efficiently guided in the wave guiding region, eventually towards the wavelength converting material.

In embodiments of the present invention, the thickness of the wave guiding region may increase gradually along a direction towards the wavelength converting material.

When the thickness of the wave guiding region increases gradually, it will form a wedge shaped wave guiding region, which promotes light reflection towards the wavelength converting material. The wedge shape will also have a collimating effect on the light in the wave guiding region.

In embodiments of the present invention, the thickness of said wavelength converting material may increase gradually with the distance from the wave guiding region.

A wedge shaped wavelength converting region will have a collimating effect on the converted light, to collimate the light exiting the device.

In embodiments of the present invention, the wavelength converting material may be arranged outside the lateral edge of the light emitting diode.

When light is wavelength converted in the wavelength converting material, heat is generated. When the material is arranged laterally outside the LED, it is in contact direct contact with the substrate, which in general is good in transporting heat. Hence, the substrate will act as a heat sink for the wavelength converting material. The heat from the wavelength converting material will hence not warm-up the LED, which generally has a reduced efficiency at higher temperatures and can have slight color shifts with temperature.

In embodiments of the present invention, at least part of the wavelength converting material may be arranged on a part of the at least one light emitting diode.

When the wavelength converting material is arranged on a part of the LED, a more compact design is possible to achieve. Further, the light utilization efficiency is high since a portion of the light from the LED is emitted directly into the wavelength converting material without passing through the wave guiding region.

In embodiments of the present invention, the wavelength converting material may in a first domain comprise a first wavelength converting composition for converting light emitted by the light emitting diode into a first converted wavelength range, and may in a second domain comprises a second wavelength converting composition for converting light emitted by said light emitting diode into a second converted wavelength range.

This gives the possibility for providing light of two separate colors from a single LED or a set of LEDs all emitting light of the same color. The different domains could be disposed adjacent to each other to provide a mixed color emission, or may for example be disposed on mutually opposite sides of the wave guiding regions to obtain a first color output in one direction and a second color output in the opposite direction.

In embodiments of the present invention, the wave guiding region may comprise a solid transparent material.

A solid wave guiding region can result in more efficient light extraction from the LED as less light is reflected from the high index LED material to a higher index solid layer than to air. In addition, the critical angle of total internal reflection is increased by a solid body.

BRIEF DESCRIPTION OF THE DRAWINGS

This and other aspects of the present invention will now be described in more detail, with reference to the appended drawings showing a currently preferred embodiment of the invention. The drawings are not necessary according to scale.

DETAILED DESCRIPTION

Figure 1:
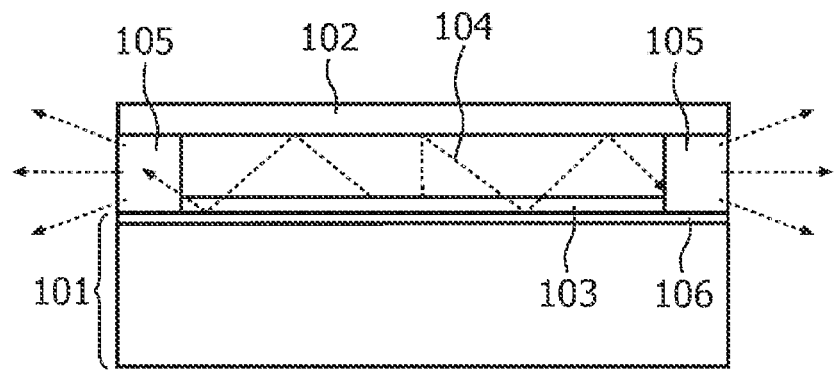
FIG. 1 shows, in cross-sectional view, one embodiment of a light emitting device of the present invention.

One embodiment of a side emitting light emitting device, schematically illustrated in FIG. 1 comprises a substrate 101 and a reflector 102 arranged at a certain distance from the substrate 101. On the substrate 101 and facing the reflector 102 is arranged a light emitting diode 103. Not shown in this drawing, but also present in the device as conventional in the art is driving circuitry for the LED.

In this embodiment, the substrate 101 and the reflector 102 are illustrated as being essentially parallel, but as will follow from the description below, this is not necessary for all embodiments of the invention.

The substrate 101 and the reflector 102 form an upper and a lower limit for a wave guiding region 104. The light emitting diode 103 emits light into the wave guiding region 104. On the lateral sides of and outside the wave guiding region 104 and the LED 103, and extending between the substrate 101 and the reflector 102, is arranged a wavelength converting material 105. The wavelength converting material 105 absorbs light of the wavelength band emitted by the LED 103 and emits light of a converted wavelength band, which is different from the LED-emitted wavelength band. Typically, the conversion causes a shift in wavelengths towards longer wavelengths. The substrate 101 is a support for the LED 103 and may be of a multi layer structure. Typically, the substrate 101 comprises a layer 106 that is reflective to the light emitted by the LED. The reflective layer 106 may be a reflective backplane of the LED 103, which combines an electrode function with the reflective function. The reflective layer typically comprises a metal, such as Ag or Al. The reflector 102 may be self supporting, arranged on a reflector carrier substrate, or may, in the case the wave guiding region 104 comprises a solid body material, be arranged on the top surface of that body. The reflector might be a metal reflector, such as enhanced aluminum or silver reflectors. A suitable thickness of such a metal layer is in the order of from about 50 to about 500 nm, typically about 200 nm. The reflector 102 might alternatively be a diffuse scattering layer with high backscattering reflectivity (e.g. R>95%). This layer may for example consist of a polymeric binder with $TiO_2$-particles with a size of from about 100 to about 1000 nm, typically about 300 nm. Alternatively, the layer may consist of inorganic scattering layers, such as porous alumina, porous YAG or bariumsulphate coatings. The layer may be directly deposited on a supporting carrier substrate or on the wave guiding body, for instance by spraycoating or spincoating or dipcoating.

The reflector 102 may also be a dielectric mirror designed to effectively reflect the wavelength range of the LED emission. Typically, such mirrors comprise a multilayer structure of thin stacks of alternating high and low refractive index materials, such as silica and tantalum oxide. The light emitting diode 103 is arranged on the substrate 101. The light from the LED 103 typically has a substantial angular spread, such as emission in a half sphere pattern or lower spread, and has typically a main direction of light emission which is perpendicular from the surface of the substrate, a so called top emissive LED. However, other types of LEDs may also be used in a device of the present invention.

As used in this application, the term "light emitting diode" herein abbreviated "LED" refers to any type of light emitting diode or laser emitting diode known to those skilled in the art, including, but not limited to inorganic based LEDs, small organic molecule based LEDs (smOLEDs) and polymeric based LEDs (polyLEDs). The light emitted by an LED suitable for use in the present invention is typically within the wavelength range of from UV light to visible light. For visible light, the emission may be of any color, from violet to red. The LED 103 emits light into the region between the substrate 101 and the reflector 102. This region is herein denoted as the wave guiding region 104. A purpose of this wave guiding region 104 is to guide the light from the LED 103 to the wavelength converting material 105. In this wave guiding region, light is reflected back and forth between the reflective surfaces and will eventually encounter the wavelength converting material 105.

The wave guiding region is preferably essentially transparent to light of the wavelengths emitted by the LED(s) of the device, such as not to absorb light in an appreciable extent.

The wave guiding region 104 may be an open void, filled with any gas, such as e.g. air, or alternatively vacuum, or may be of a solid material. Examples of solid materials suitable for use in a solid body wave guiding region include, but are not limited to solid inorganic materials, such as alumina, glass, fused silica, sapphire, and YAG, and silicones, fluoropolymers, polyolefins or other polymers. The solid body wave guiding region may further comprise an additional amount of scattering material to obtain a homogenous light distribution in the region. The scattering can help to redistribute the light in the device, facilitating emission towards the lateral edges of the wave guiding region.

Preferably, the solid layer has an index substantially matched to the index of the LED materials (which might be n=2.7 or higher).

The solid wave guiding region can be a support for the LED. Usually LEDs are grown on supporting transparent substrates like sapphire or silicon carbide. This transparent substrate may be used as the light guiding body. Wavelength converting material 105 is located at the lateral edge of, outside the wave guiding region 104 and the LED 103. Hence, essentially all light exiting the wave guiding region will enter the wavelength converting material.

The wavelength converting material 105 is a material which upon absorption of light of a certain wavelength or wavelength range, emits light of a different, converted, wavelength or wavelength range. Typically, the converted wavelengths are shifted towards longer wavelengths. Conventionally, such materials are typically fluorescent and/or phosphorescent. Many such wavelength converting materials are known to those skilled in the art, and one commonly used group of compound goes under the name "phosphors".

The wavelength converting material may for example be ceramic, solid materials or embedded in a binder material, such as a carrier polymer.

The wavelength converting material 105 is matched to the LED 103 such that it absorbs at least part of the light emitted by the LED. Hence, the selection of wavelength converting material depends on the selection of LED. For example, the wavelength converting material may partly convert blue light into green/yellow light, which mixes into white light. However, other wavelength converting materials may be used as well, for example fully converting blue into green, yellow or red, or converting UV-light into visible light. It is also possible that the wavelength converting material 105 comprises two or more different wavelength converting compositions, for example a first composition converting the LED-light into a first color, and a second composition converting the LED-light into a second color. The two or more components may be arranged on top of each other in separate layers, together forming the wavelength converting material 105, or may be intermixed to form the wavelength converting material 105.

Figure 2:
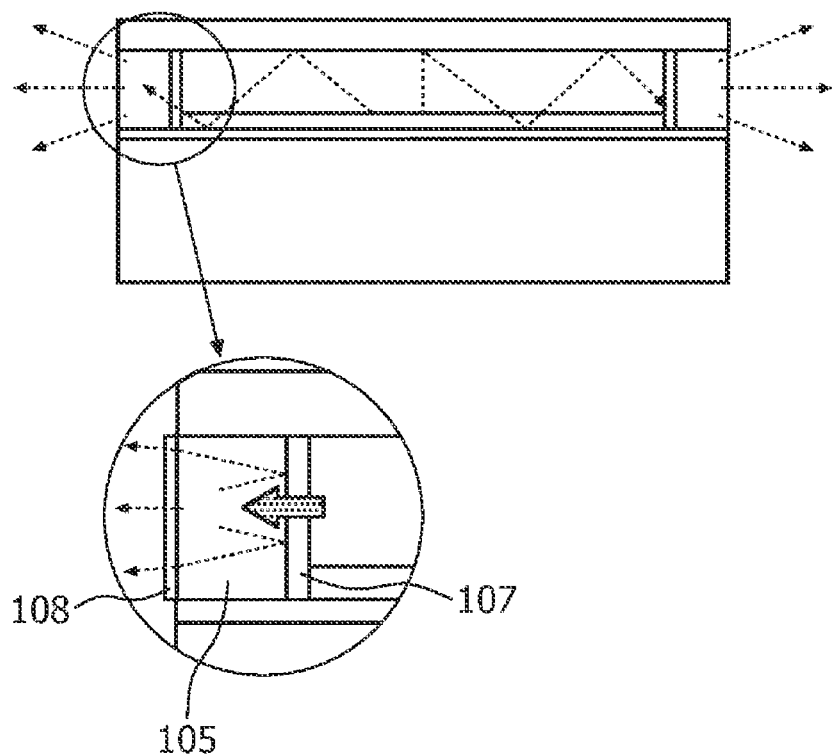
FIG. 2 shows, in cross-sectional view, another embodiment of a light emitting device of the present invention.

In an alternative to the embodiment in FIG. 1 (not shown), at least a part of the wavelength converting material may be arranged on a part of the LED. In such a case, the lateral edge of the wave guiding region is inside the lateral edge of the LED. The light emitted by the LED at its lateral edge is directly coupled into the wavelength converting material, without passing the wave guiding region. In such an alternative, the total area of the device can be reduced, even to the degree where the footprint of the device equals the footprint of the LED it self. A second embodiment of a light emitting device of the present invention is illustrated in FIG. 2, and comprises, in addition to the device illustrated in FIG. 1, a first and a second dichroic mirror 107 and 108, sandwiching the wavelength converting material 105. The concept of dichroic mirrors as such is known to those skilled in the art, for example they may comprise a multilayer stack of alternating high and low refractive index. The first, inner, dichroic mirror 107 is arranged between the wave guiding layer 104 and the wavelength converting material 105, and is adapted to transmit light emitted by the LED 103, but to reflect light emitted by the wavelength converting material 105, i.e. converted light.

When light is converted in the wavelength converting material 105, it is emitted there from in many different directions. Hence, a portion of the converted light will be emitted from the converting material in a direction back towards the wave guiding region 104. This decreases the light utilization efficiency of the device, and to also utilize this converted light, the inner dichroic mirror 107 reflects this light into the forward direction, i.e. out from the device through the wavelength converting material 105. A further effect of the inner mirror 107 is that the amount of wavelength converting material 105 may be decreased in order to achieve the same degree of conversion as without the inner mirror. The second, outer, dichroic mirror 108 is arranged on the outside of the wavelength converting material 105. A few alternatives are possible for the outer mirror 108. In a first alternative, it is adapted to transmit converted light, i.e. light emitted by the wavelength converting material 105, but to reflect unconverted light, i.e. direct light from the LED 103. Hence, only converted light will exit the device, leading to a high degree conversion.

In a second alternative, the outer dichroic mirror 108 is adapted to transmit only converted light with a low angle of incidence on the outer mirror, while reflecting the remaining light. The consequence is that the light exiting the device through the outer mirror 108 will have a reduced angular spread.

When the second dichroic mirror 108 is used in conjunction with the first dichroic mirror 107, converted light will be reflected back and forth in the wavelength converting material until it meets the requirements of exiting the device. This will increase the light utilization and may also be used to decrease the amount of wavelength converting material 105.

Figure 3:
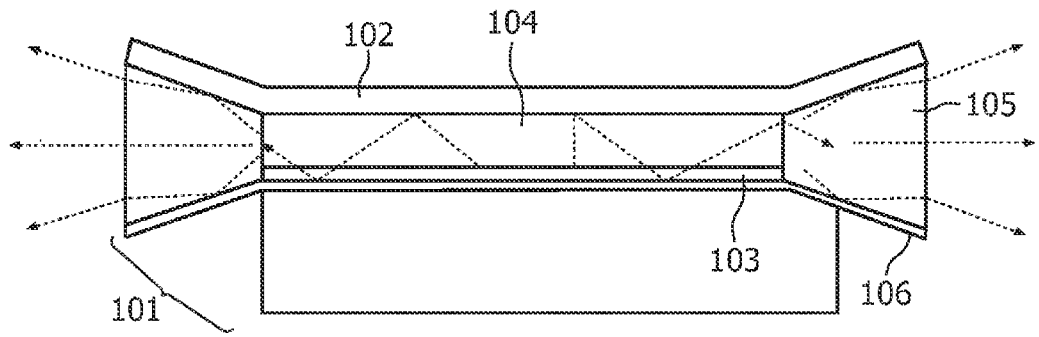
FIG. 3 shows, in cross-sectional view, yet another embodiment of a light emitting device of the present invention.

As will be appreciated by those skilled in the art, a device of the present invention may utilize a first and/or a second dichroic mirror as described above. A third embodiment of a light emitting device of the present invention is schematically illustrated in FIG. 3. In this embodiment, the thickness of the wavelength converting material 105, and thus also the vertical distance between the substrate 101 and the reflector 102, increases with the distance from the wave guiding region. This gives the wavelength converting material 105 a generally conical cross section. Due to this shape, and the gradually increasing distance between the substrate and reflector, the wavelength converting portion of the device has a collimating action on the light introduced therein.

Figure 4:
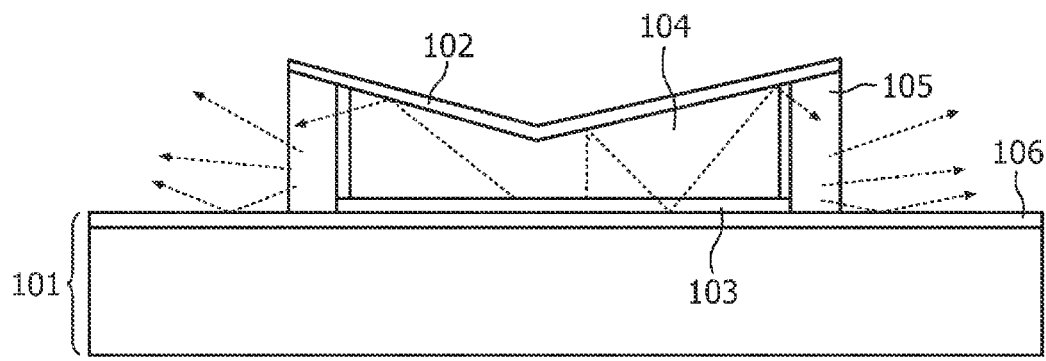
FIG. 4 shows, in cross-sectional view, yet another embodiment of a light emitting device of the present invention.

As appreciated by those skilled in the art, the dichroic mirrors discussed above may also be present and used in this embodiment of the invention. A fourth embodiment of a light emitting device of the present invention is schematically illustrated in FIG. 4. In this embodiment, the thickness of the waveguiding region 104, and so the vertical distance between the substrate and the reflector, increases along a direction towards the wavelength converting material 105. In other words, thickness of the waveguiding region 104, and so the vertical distance between the substrate and the reflector, decreases with the distance from the wavelength converting material 105. This is accomplished by shaping the reflector 102 or by shaping the body on which the reflector is applied.

The slanted boundaries of the waveguiding region 104 direct the light towards the wavelength converting material. This is especially advantageous when the reflector and/or the substrate is a specular reflecting surface.

As appreciated by those skilled in the art, the dichroic mirrors discussed above may also be present and used in this embodiment of the invention. The typical LED die size is about 1×1 mm, but also smaller or larger dimensions may be used. The typical thickness, or height, of the waveguiding region and the wavelength converting material is in the range of from about 10 μm to a few mm, such as from 10 μm to 2 mm, such as in the range of from 50 to 500 μm, typically about 200 μm. The "thickness" is counted along the vertical distance between the substrate and the reflector. Typically, the wave guiding region and the wavelength converting material is of essentially the same thickness, such that the wavelength converting material essentially covers the full height of the lateral edge of the wave guiding region. The width of the wavelength converting material may range between about 10 and 500 μm, typically about 50 to 200 μm. The "width" of the wavelength converting material is counted along the direction from the lateral edge of the wave guiding region towards the lateral edge of the wavelength converting material.

The person skilled in the art realizes that the present invention by no means is limited to the preferred embodiments described above. On the contrary, many modifications and variations are possible within the scope of the appended claims. For example, a light emitting device of the present invention may take many physical shapes, while still being encompassed by the scope of the claims. For example, in top view, the LED may form the center of the device, with the wavelength converting material essentially surrounding the LED and the waveguiding region. Examples of such a design is an essentially round device, the wavelength converting material forming a ring around the LED, or a polygonic device, the wavelength converting material forming the sides of the polygon, such as a square. In other examples, the device is closed on one or more lateral sides of the LED, with the wavelength converting material arranged at the open lateral side(s) of the LED. One such example is a square device where two of the opposing lateral sides are closed, while wavelength converting material is arranged at the other two, open, lateral sides.

Further, the wavelength converting material may comprise two or more separate domains where the wavelength converting material in a first domain converts the light emitted by the LED into a first converted color, and where the wavelength converting material in a second domain converts the light emitted by the LED into a second converted color. In one such example, the device is a square device, where the first domain represents a first half perimeter (two sides) of wavelength converting material and the second domain represents the second half perimeter (opposing two sides) of wavelength converting material.

The wave guiding region of the device may in some embodiments comprise a wavelength converting material, different from the wavelength converting material arranged laterally outside the wave guiding region. Such a wavelength converting material in the waveguiding region may be used to have better control of the light emitted by the device. It may convert a portion of the light emitted by the LED, which converted light, together with the converted light emitted by the lateral wavelength converting material, results in a desired color of light. For obtaining collimated light in a single general direction from a side emitting light emitting device of the present invention, the device may be arranged in a collimator, such as in the bottom of a parabolic or correspondingly shaped reflector emitting light towards the sides of the reflector, so that all light emanating from the device is collected and sent in a single general direction.

In the drawings, the substrate and the reflector are illustrated as having their lateral edges coinciding with the lateral edges of the wavelength converting material. However, it is also possible that the lateral edges of at least one of the substrate and the reflector is outside of the wavelength converting material, i.e. the area of the substrate and/or the reflector is substantially larger than the combined area of the waveguiding region and the wavelength converting material. When the reflective layer of the substrate and the reflector extends outside of the wavelength converting material, they may be shaped such that they form a collimator, for instance by letting the vertical distance between the reflective layer of the substrate and the reflector outside the wavelength converting material to increase with the distance from the wavelength converting material, so as to form a tapered space therebetween.

It is also possible that the reflector does not cover the top surface of the wavelength converting material, or only covers a portion of that top surface. To summarize, a side-emitting light emitting device is provided, comprising a substrate, a reflector arranged spaced apart from said substrate and extending along the extension of said substrate, and at least one light emitting diode arranged on said substrate and facing said reflector, said substrate and reflector delimiting a wave guiding region for light emitted by said at least one light emitting diode. Further, a wavelength converting material is arranged at the lateral edge of said wave guiding region. The invention provides a compact side emitter with controlled color emission. A light emitting device of the present invention may be for example be used within the areas of LED-illumination, for example for back light application in display devices, in light guide applications, including flat light guide luminaries, LED collimator configurations, such as can be used for automotive head lighting or general LED-spot lighting or flash light modules. The areas of use are however not limited to the above.

The invention claimed is:

1. A side-emitting light emitting device comprising:
a substrate,
a reflector spaced apart from said substrate and extending along an extension of said substrate,
at least one light emitting diode arranged on said substrate and facing said reflector, said substrate and reflector delimiting a wave guiding region for light emitted by said at least one light emitting diode, and a wavelength converting material arranged at a lateral edge of said wave guiding region.

2. A light emitting device according to claim 1, wherein said wavelength converting material is arranged between said reflector and said substrate.

3. A light emitting device according to claim 1, wherein a first dichroic mirror is arranged between said wave guiding region and said wavelength converting material.

4. A light emitting device according to claim 1, wherein said wavelength converting material is arranged between a second dichroic mirror and said wave guiding region.

5. A light emitting device according to claim 1, wherein said wavelength converting material is present on two mutually opposing sides of said wave guiding region.

6. A light emitting device according to claim 1 wherein said substrate comprises a reflective layer.

7. A light emitting device according to claim 1 wherein the thickness of said wave guiding region increases gradually along a direction towards said wavelength converting material.

8. A light emitting, device according to claim 1, wherein the thickness of said wavelength converting material increases gradually with the distance from the wave guiding region.

9. A light emitting device according to claim 1, wherein said wavelength converting material is arranged outside a lateral edge of said light emitting diode.

10. A light emitting device according to claim 1 wherein at least part of said wavelength converting material is arranged on a part of said at least one light emitting diode.

11. A light emitting device according to claim 1 wherein said wavelength converting material in a first domain comprises a first wavelength converting composition for converting light emitted by said LED into a first converted wavelength range, and in a second domain comprises a second wavelength converting composition for converting light emitted by said LED into a second converted wavelength range.

12. A light emitting device according to claim 1, wherein said wave guiding region comprises a solid transparent material producing substantially no wavelength conversion of light emitted by said light-emitting diode.

* * * * *